United States Patent
Maeda (10) Patent No.: US 9,869,936 B2
(45) Date of Patent: Jan. 16, 2018

(54) DETECTION APPARATUS, MEASUREMENT APPARATUS, LITHOGRAPHY APPARATUS, AND METHOD OF MANUFACTURING ARTICLE

(71) Applicant: CANON KABUSHIKI KAISHA, Tokyo (JP)

(72) Inventor: Hironori Maeda, Utsunomiya (JP)

(73) Assignee: CANON KABUSHIKI KAISHA, Tokyo (JP)

(*) Notice: Subject to any disclaimer, the term of this patent is extended or adjusted under 35 U.S.C. 154(b) by 0 days.

(21) Appl. No.: 15/099,774

(22) Filed: Apr. 15, 2016

(65) Prior Publication Data

US 2016/0320710 A1 Nov. 3, 2016

(30) Foreign Application Priority Data

Apr. 30, 2015 (JP) ................................ 2015-093518

(51) Int. Cl.
G03F 7/20 (2006.01)
G03F 9/00 (2006.01)
G01B 11/06 (2006.01)
G01B 11/14 (2006.01)

(52) U.S. Cl.
CPC ...... *G03F 7/70191* (2013.01); *G01B 11/0608* (2013.01); *G01B 11/14* (2013.01); *G03F 9/7026* (2013.01)

(58) Field of Classification Search
CPC .................................................. G03F 7/70608
See application file for complete search history.

(56) References Cited

U.S. PATENT DOCUMENTS

| | | | | |
|---|---|---|---|---|
| 4,864,123 A * | 9/1989 | Mizutani | ................. | G01S 7/499 250/225 |
| 5,209,813 A * | 5/1993 | Oshida | .................. | B82Y 10/00 216/41 |
| 2002/0093656 A1* | 7/2002 | Takeuchi | ............ | G03F 7/70675 356/394 |
| 2009/0004763 A1 | 1/2009 | Ono et al. | | |
| 2015/0346609 A1 | 12/2015 | Den Boef | | |

FOREIGN PATENT DOCUMENTS

| | | |
|---|---|---|
| JP | H04254319 A | 9/1992 |
| JP | H05182896 A | 7/1993 |
| JP | 3139023 B2 | 2/2001 |

OTHER PUBLICATIONS

Extended European Search Report issued in European Appln. No. 16000707.6 dated Jan. 25, 2017.
Office Action issued in Taiwanese Appln. No. 105110583 dated Feb. 14, 2017. English translation provided.

* cited by examiner

*Primary Examiner* — Steven H Whitesell Gordon
(74) *Attorney, Agent, or Firm* — Rossi, Kimms & McDowell LLP (57) ABSTRACT

The present invention provides a detection apparatus which causes light to be incident obliquely on a substrate including a plurality of layers whose refractive indices are different from each other and detects a height of the substrate using light reflected from the substrate, the apparatus comprising an optical system including a polarizer for reducing s-polarized light and configured to cause light, in which s-polarized light has been reduced by the polarizer, to be incident on the substrate at an angle of incidence within a range of 40° to 55°.

10 Claims, 7 Drawing Sheets

DETECTION APPARATUS, MEASUREMENT APPARATUS, LITHOGRAPHY APPARATUS, AND METHOD OF MANUFACTURING ARTICLE

BACKGROUND OF THE INVENTION

Field of the Invention

The present invention relates to a detection apparatus, a measurement apparatus, an lithography apparatus, and a method of manufacturing an article.

Description of the Related Art

A detection apparatus which causes light to be obliquely incident on a substrate and detects the height of the substrate using light reflected by the substrate may detect the height of a substrate where a plurality of layers having different refractive indices are overlapped, such as a substrate where a resist layer is formed on an Si layer. In this case, light reflected by the surface of the top layer out of the plurality of layers and light reflected by the interface between the top layer and its underlying layer are incident on the light receiving device of the detection apparatus. Therefore, when detecting the height of the substrate using the light reflected by the interface, the light reflected by the surface of the top layer may become a noise component and a detection error may be generated. That is, in order to detect the height of the substrate accurately by reducing the detection error, the intensity difference between the light reflected by the interface and the light reflected by the surface of the top layer is preferably maximized. Japanese Patent No. 3139023 has proposed a method of reducing the light reflected by the surface of the top layer by causing p-polarized light to be incident on a substrate at the Brewster's angle.

P-polarized light is not reflected by the surface of the top layer on the substrate if it is incident on the substrate at the Brewster's angle as in the method described in Japanese Patent No. 3139023. It is therefore possible to detect the height of the substrate using only p-polarized light reflected by the interface. It is extremely difficult, however, to extract only p-polarized light by removing s-polarized light completely from light. Therefore, even in the method described in Japanese Patent No. 3139023, the detection error may also be generated when s-polarized light is reflected by the surface of the top layer on the substrate.

SUMMARY OF THE INVENTION

The present invention provides, for example, a technique advantageous in terms of precision with which a height of a substrate is detected.

According to one aspect of the present invention, there is provided a detection apparatus which causes light to be incident obliquely on a substrate including a plurality of layers whose refractive indices are different from each other and detects a height of the substrate using light reflected from the substrate, the apparatus comprising: an optical system including a polarizer for reducing s-polarized light and configured to cause light, in which s-polarized light has been reduced by the polarizer, to be incident on the substrate at an angle of incidence within a range of 40° to 55°.

Further features of the present invention will become apparent from the following description of exemplary embodiments with reference to the attached drawings.

DESCRIPTION OF THE EMBODIMENTS

Exemplary embodiments of the present invention will be described below with reference to the accompanying drawings. Note that the same reference numerals denote the same members throughout the drawings, and a repetitive description thereof will not be given. An example will be described below in which the present invention is applied to an exposure apparatus (scanner) that scans and exposes a substrate using slit-shaped light. However, the present invention may be applied to an exposure apparatus (stepper) that exposes the substrate without moving a mask and the substrate relatively. Further, the present invention may be applied to a lithography apparatus such as an imprint apparatus or a drawing apparatus.

First Embodiment

Figure 1:
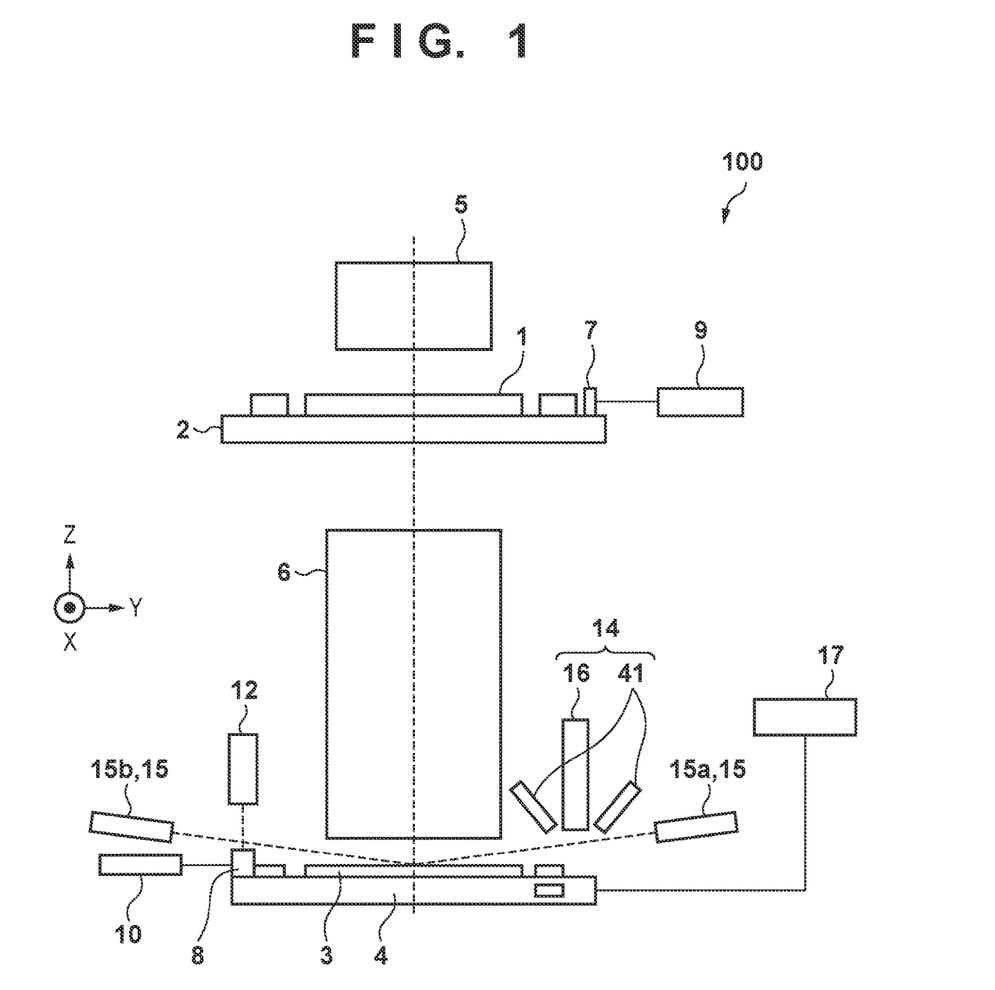
FIG. 1 is a schematic view showing an exposure apparatus according to the first embodiment.

An exposure apparatus 100 according to the first embodiment of the present invention will be described with reference to FIG. 1. FIG. 1 is a schematic view showing the exposure apparatus 100 according to the first embodiment. The exposure apparatus 100 is, for example, an exposure apparatus which scans and exposes a substrate 3 using slit-shaped light, and can include an illumination optical system 5, a mask stage 2, a projection optical system 6, a substrate stage 4, a measurement unit 14 (measurement apparatus), and a control unit 17. The control unit 17 includes, for example, a CPU and a memory, and controls the respective units of the exposure apparatus 100 (controls scanning exposure of the substrate 3).

The illumination optical system 5 illuminates a mask 1 with light emitted from a light source. As the light source, for example, a KrF excimer laser, and an ArF excimer laser and an $F_2$ laser each having a shorter wavelength can be used, in addition to a mercury lamp. The mask 1 and the substrate 3 are held by the mask stage 2 and the substrate stage 4, respectively, and are arranged optically in almost conjugate positions (positions of the object plane and the image plane of the projection optical system 6) via the projection optical system 6.

The mask stage 2 can be configured to be movable in, for example, directions (X and Y directions) perpendicular to the optical axis of the projection optical system 6, and to be rotatable in a θZ direction (a rotational direction around the Z-axis) while holding the mask 1. For example, a first position detection unit 9 including a laser interferometer detects the position of the mask stage 2. The laser interferometer included in the first position detection unit 9 irradiates the side surface of a reflecting member 7 provided on the mask stage 2 with a laser beam and detects the displacement of the mask stage 2 by the laser beam reflected by the side surface of the reflecting member 7. This allows the first position detection unit 9 to obtain the current position of the mask stage 2 based on the detected displacement.

The substrate stage 4 can be configured to be movable in, for example, a direction (Z direction) parallel to the optical axis of the projection optical system 6 or the directions (X and Y directions) perpendicular to the optical axis, and to be rotatable in a θX direction, a θY direction, and the θZ direction while holding the substrate 3. The θX direction is a rotational direction around the X-axis and the θY direction is a rotational direction around the Y-axis. For example, a second position detection unit 10 and a third position detection unit 12 each including a laser interferometer detect the position of the substrate stage 4. The laser interferometer included in the second position detection unit 10 irradiates the side surface of a reflecting member 8 provided on the substrate stage 4 with a laser beam and detects the displacement of the substrate stage 4 in the X and Y directions by the laser beam reflected by the side surface of the reflecting member 8. This allows the second position detection unit 10 to obtain the current position of the substrate stage 4 in the X and Y directions and the θZ direction based on the detected displacement. The laser interferometer included in the third position detection unit 12 irradiates the upper surface of the reflecting member 8 provided on the substrate stage 4 with a laser beam and detects the displacement of the substrate stage 4 in the Z direction by the laser beam reflected by the upper surface of the reflecting member 8. This allows the third position detection unit 12 to obtain the current position of the substrate stage 4 in the Z direction, the θX direction, and the θY direction based on the detected displacement.

The projection optical system 6 has a predetermined projection magnification (for example, ¼ or ⅕) and projects a pattern formed on the mask 1 onto the substrate 3. Based on detection results by the first position detection unit 9 and the second position detection unit 10, the control unit 17 relatively scans the mask stage 2 and the substrate stage 4 in the direction (for example, the Y direction) perpendicular to the optical axis of the projection optical system 6 at the speed ratio corresponding to the projection magnification of the projection optical system 6.

The exposure apparatus 100 also includes a focus detection unit 15 which detects the height of the substrate 3 while performing scanning exposure. The focus detection unit 15 can include an irradiation system 15a which irradiates the substrate 3 with light such that the light is obliquely incident on the substrate 3 and a detection system 15b which detects the height of the substrate 3 by receiving the light reflected by the substrate 3. The detection system 15b includes, for example, an image sensor and can obtain the height of the substrate 3 based on a position on the image sensor on which light has been incident. The control unit 17 controls, based on detection results by the focus detection unit 15 and the third position detection unit 12, the position of the substrate stage 4 in the Z direction such that the surface of the substrate 3 is arranged on the imaging plane (focus plane) of the projection optical system 6 while performing scanning exposure. This allows the control unit 17 to transfer the pattern formed on the mask 1 to the substrate 3.

The measurement unit 14 (measurement apparatus) is a so-called off-axis alignment measurement apparatus which measures the position of a mark (alignment mark) provided on the substrate 3 without going through the projection optical system 6. The measurement unit 14 can include, for example, an image capturing unit 16 which captures the mark on the substrate, a detection unit 41 (detection apparatus) which detects the height of the substrate 3, a substrate stage that can move while holding the substrate 3, and a processing unit which obtains the position of the mark based on the image captured by the image capturing unit 16. In the first embodiment, the substrate stage of the measurement unit 14 is the same as the substrate stage 4 of exposure apparatus 100 shown in FIG. 1. The processing unit of the measurement unit 14 can be included in the control unit 17 of the exposure apparatus 100 shown in FIG. 1. However, the processing unit of the measurement unit 14 may be provided separately from the control unit 17. The measurement unit 14 in the exposure apparatus 100 of the first embodiment adopts an off-axis alignment method as a method of measuring the position of the mark provided on the substrate 3. However, the present invention is not limited to this. The measurement unit 14 may adopt, for example, a TTL (Through The Lens) alignment method of detecting the position of the mark via the mask 1 and the projection optical system 6.

Figure 2:
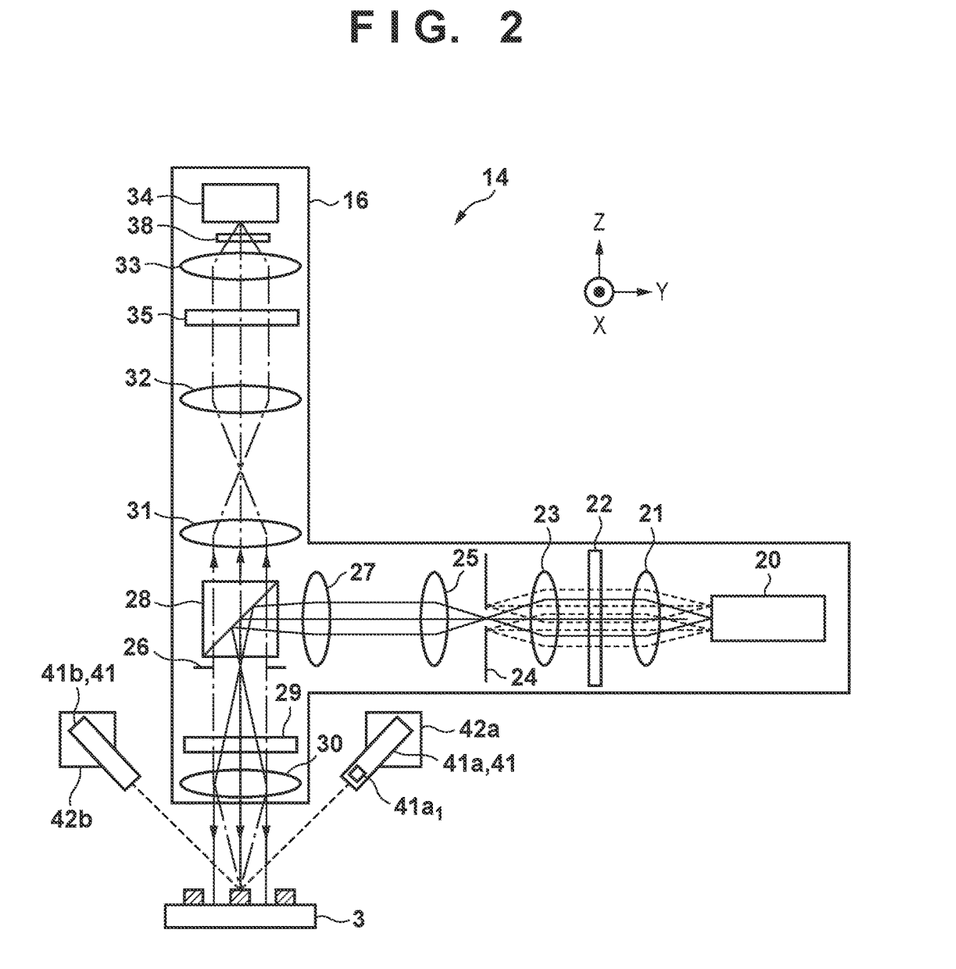
FIG. 2 is a view showing the arrangement of a measurement unit.

FIG. 2 is a view showing the arrangement of the measurement unit 14 (the image capturing unit 16 and the detection unit 41). First, the image capturing unit 16 will be described. Light emitted from a light source 20 passes through a first condenser lens 21, a wavelength filter 22, and a second condenser lens 23, and is then incident on an aperture stop 24 provided in a position corresponding to the pupil plane (the optical Fourier transform plane with respect to the object plane) of the image capturing unit 16. The light passing through the aperture stop 24 passes through a first illumination optical system 25 and a second illumination optical system 27, and is then incident on a polarizing beam splitter 28. The light (s-polarized light) reflected by the polarizing beam splitter 28 is converted into circularly polarized light by passing through an NA stop 26 and a λ/4 plate 29, and illuminates the mark on the substrate through an objective lens 30. The NA stop 26 can change an NA (numerical aperture) by changing an amount of aperture.

The light (reflected light, diffracted light, and scattered light) reflected by the mark on the substrate is converted into p-polarized light by passing through the objective lens 30 and the λ/4 plate 29 again, and is transmitted through the polarizing beam splitter 28. The light (p-polarized light) that has been transmitted through the polarizing beam splitter 28 passes through a relay lens 31, a first imaging optical system 32, a first optical member 35, a second imaging optical system 33, and a second optical member 38, and is then incident on an image sensor 34. The first optical member 35 is, for example, an optical member for adjusting a coma aberration. The second optical member 38 is, for example, an optical member for adjusting a wavelength shift difference. The image sensor 34 converts incident light into an electrical signal and supplies the converted electrical signal to the control unit 17 (processing unit). By configuring the image capturing unit 16 as described above, the control unit 17 (processing unit) can obtain the position of the mark on the substrate based on the image obtained by causing the image capturing unit 16 to capture the mark.

Next, the detection unit 41 will be described. The detection unit 41 can include an optical system 41a which causes light to be obliquely incident on the substrate 3 and a detection system 41b which detects the height of the substrate 3 by receiving the light reflected by the substrate 3. The optical system 41a includes, for example, a polarizer 41$a_1$ which reduces s-polarized light out of light containing p-polarized light and s-polarized light, and causes light, in which s-polarized light has been reduced by the polarizer 41$a_1$, to be obliquely incident on the substrate 3. The detection system 41b includes, for example, an image sensor and can obtain the height of the substrate 3 based on a position on the image sensor on which the light has been incident. The control unit 17 controls the position of the substrate stage 4 in the Z direction such that the height of the substrate 3 falls within the allowable range (tolerance) of the imaging position (focus position) of the image capturing unit 16.

Figure 3:
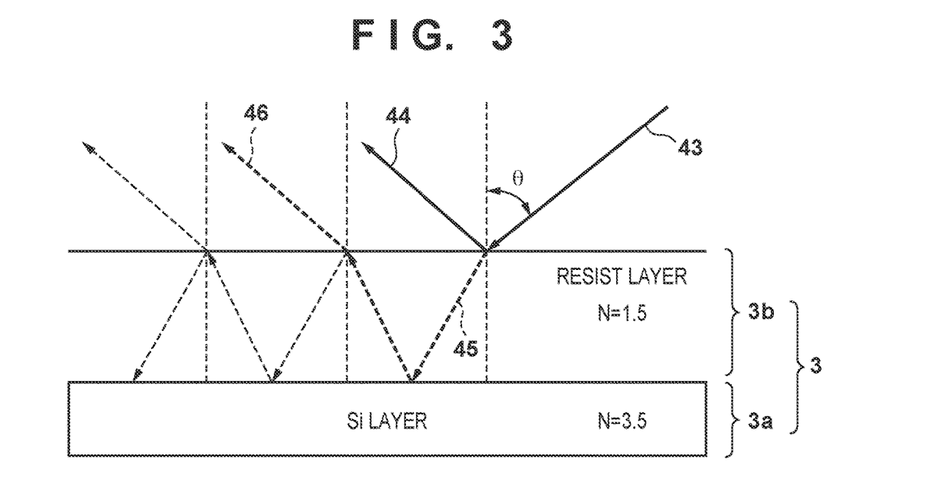
FIG. 3 is a view for explaining light reflection in a substrate.

Reflection in the substrate 3 of the light obliquely incident on the substrate 3 will now be described. The exposure apparatus 100 may detect the height of the substrate 3 where a plurality of layers having different refractive indices are overlapped, such as a substrate where a resist layer 3b is formed on an Si layer 3a. FIG. 3 is a view for explaining light reflection in the substrate 3 where the Si layer 3a (refractive index N=3.5) and the resist layer 3b (refractive index N=1.5) are overlapped. For example, as shown in FIG. 3, a light intensity obtained when light 43 containing p-polarized light and s-polarized light is obliquely incident on the substrate 3 at an angle θ of incidence will be considered. The light 43 obliquely incident on the resist layer 3b at the angle θ of incidence is divided into light 44 reflected by the surface of the resist layer 3b (to be referred to as "surface-reflected light" hereinafter) and light 45 propagating through the resist layer 3b. The light 45 propagating through the resist layer 3b is reflected by the interface between the Si layer 3a and the resist layer 3b (to be simply referred to as the "interface" hereinafter), and becomes light 46 which is transmitted from the surface of the resist layer 3b to air (to be referred to as "interface-reflected light" hereinafter). The intensity of the surface-reflected light and the intensity of the interface-reflected light at this time are different depending on the angle θ of incidence.

Figure 4:
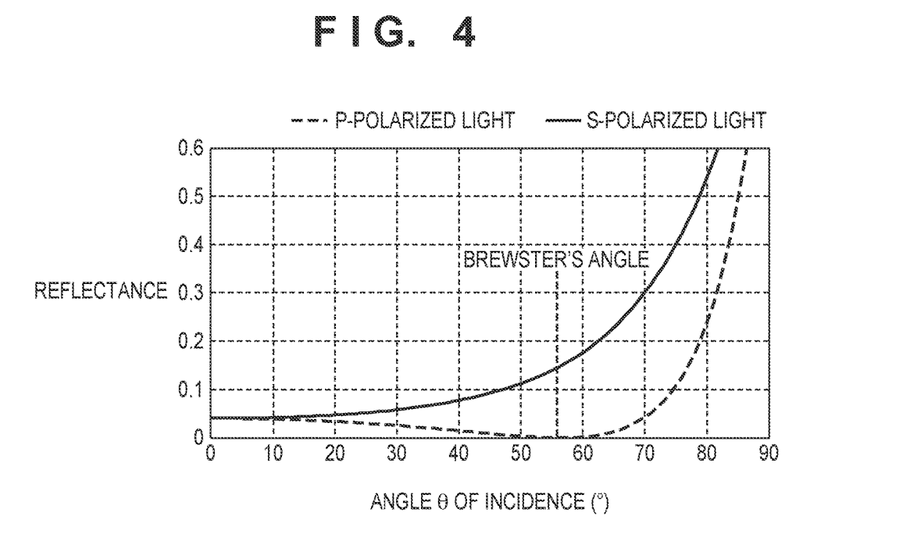
FIG. 4 is a graph showing the relationship between a reflectance, and an angle θ of incidence in each of p-polarized light and s-polarized light.

FIG. 4 is a graph showing the relationship between a reflectance on the surface of the resist layer 3b, and the angle θ of incidence in each of p-polarized light and s-polarized light. In FIG. 4, a broken line represents the reflectance of p-polarized light on the surface of the resist layer 3b and a solid line represents the reflectance of s-polarized light. When the angle θ of incidence is 0°, that is, when light is incident on the substrate 3 vertically, the reflectance of p-polarized light and the reflectance of s-polarized light become equal to each other. However, the reflectance difference occurs between p-polarized light and s-polarized light depending on the angle θ of incidence. Note that, as shown in FIG. 4, there is the angle θ of incidence obtained when the reflectance of p-polarized light becomes 0. The angle θ of incidence at this time is referred to as the Brewster's angle.

Figure 5A:
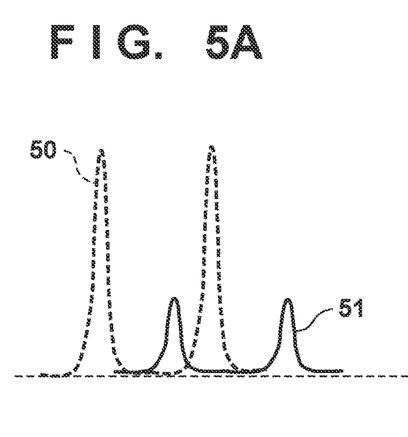
FIG. 5A is a chart showing a waveform of interface-reflected light and a waveform of surface-reflected light.

For example, when the angle θ of incidence is 10°, the reflectance of p-polarized light and the reflectance of s-polarized light are about 4% each from the relationship shown in FIG. 4. That is, the surface-reflected light reflected by the surface of the resist layer 3b is 4% of the light incident on the substrate 3 and remaining light becomes the light 45 propagating through the resist layer. The interface-reflected light reflected by the interface and exited from the surface of the resist layer 3b is obtained as about 15% of the light incident on the substrate 3 from Fresnel equations which describe a light behavior at the interface. That is, when the angle θ of incidence is 10°, the intensity of the interface-reflected light becomes about 3.8 times higher than that of the surface-reflected light and the waveform of light to be detected becomes as shown in FIG. 5A. FIG. 5A is a chart showing the waveform of the light detected when the angle θ of incidence is 10°. As shown in FIG. 5A, when the angle θ of incidence is 10°, a waveform 50 of the interface-reflected light becomes higher in intensity than a waveform 51 of the surface-reflected light. The height of the substrate 3 (the height of the interface) is detected by performing fitting on the waveform 50 of the interface-reflected light having a higher intensity.

Figure 5B:
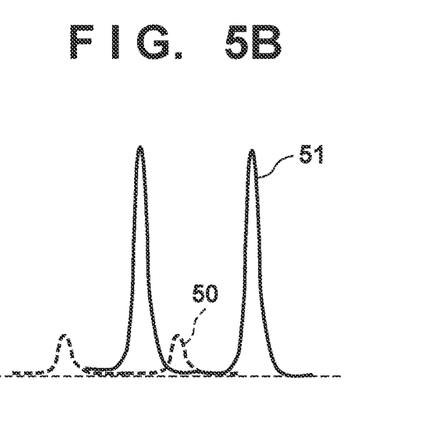
FIG. 5B is a chart showing the waveform of interface-reflected light and the waveform of surface-reflected light.

On the other hand, when the angle θ of incidence is 82°, the reflectance of p-polarized light is about 30% and the reflectance of s-polarized light is about 60% from the relationship shown in FIG. 4. That is, the surface-reflected light becomes about 30% in p-polarized light and about 60% in s-polarized light of the light incident on the substrate 3. The interface-reflected light reflected by the interface and exited from the surface of the resist layer 3b is obtained as about 7% in both p-polarized light and s-polarized light of the light incident on the substrate 3 from the Fresnel equations. That is, when the angle θ of incidence is 82°, the intensity of the surface-reflected light becomes about 4.3 times higher in p-polarized light and about 8.6 times higher in s-polarized light than that of the interface-reflected light, and the waveform of light to be detected becomes as shown in FIG. 5B. FIG. 5B is a chart showing the waveform of the light detected when the angle θ of incidence is 82°. As shown in FIG. 5B, when the angle θ of incidence is 82°, the waveform 51 of the surface-reflected light becomes higher in intensity than the waveform 50 of the interface-reflected light. The height of the substrate 3 (the surface height of the resist layer 3b) is detected by performing fitting on the waveform 51 of the surface-reflected light having a higher intensity.

As described above, it is possible to switch between detection of the surface height of the resist layer 3b and detection of the height of the interface depending on the angle θ of incidence at which light is incident on the substrate 3. For example, the surface of the resist layer 3b is preferably arranged on the imaging plane of the projection optical system 6 because the projection optical system 6 projects the pattern of the mask 1 on the surface of the resist layer 3b while performing scanning exposure. Therefore, the focus detection unit 15 preferably causes the light to be obliquely incident on the substrate 3 at the angle θ of incidence at which the surface-reflected light becomes dominant in the light detected by the detection system 15b of the focus detection unit 15. On the other hand, the interface is preferably arranged on the imaging plane of the image capturing unit 16 because the mark formed on the Si layer 3a is captured when the image capturing unit 16 of the measurement unit 14 captures the mark on the substrate 3. Therefore, the detection unit 41 of the measurement unit 14 preferably causes the light to be obliquely incident on the substrate 3 at the angle θ of incidence at which the interface-reflected light becomes dominant in the light detected by the detection system 41b of the detection unit 41.

Note that when detecting the height of the substrate 3 as described above, the waveform having the lower intensity out of the waveform 50 of the interface-reflected light and the waveform 51 of the surface-reflected light becomes a noise component, and generates a detection error. That is, in order to detect the height of the substrate 3 accurately by reducing the detection error, the intensity difference between the interface-reflected light and the surface-reflected light is preferably maximized. For example, in order for the detection unit 41 of the measurement unit 14 to detect the height of the substrate 3 (the height of the interface) accurately, the ratio of the intensity of the surface-reflected light to the intensity of the interface-reflected light is preferably minimized. As one of methods of decreasing the ratio of the intensity of the surface-reflected light to the intensity of the interface-reflected light as described above, a method of causing p-polarized light to be incident on the substrate 3 at the Brewster's angle is given as an example.

Figure 6A:
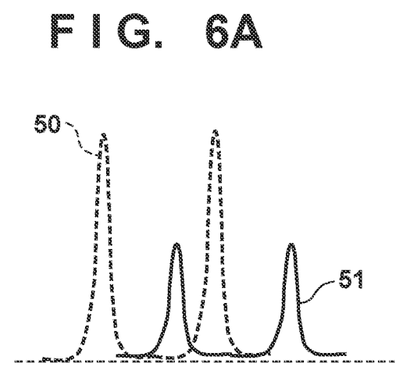
FIG. 6A is a chart showing the waveform of interface-reflected light and the waveform of surface-reflected light.
Figure 6B:
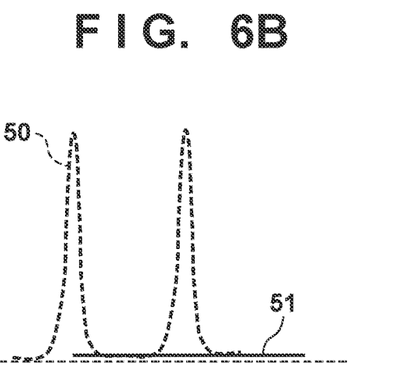
FIG. 6B is a chart showing the waveform of interface-reflected light and the waveform of surface-reflected light.

The waveform 50 of the interface-reflected light and the waveform 51 of the surface-reflected light when the light is incident on the substrate 3 at the Brewster's angle will now be described with reference to FIGS. 6A and 6B. FIG. 6A is a chart showing the waveform 50 of interface-reflected light and the waveform 51 of surface-reflected light when light containing s-polarized light and p-polarized light is incident on the substrate 3 at the Brewster's angle. FIG. 6B is a chart showing the waveform 50 of interface-reflected light and the waveform 51 of surface-reflected light when light containing only p-polarized light is incident on the substrate 3 at the Brewster's angle.

The reflectance of p-polarized light is 0% as shown in FIG. 4 when the light containing s-polarized light and p-polarized light is incident on the substrate 3 at the Brewster's angle. Therefore, all p-polarized light becomes the light 45 propagating through the resist layer 3b and is not reflected by the surface of the resist layer 3b. However, the reflectance of s-polarized light is about 15% as shown in FIG. 4. Therefore, s-polarized light is reflected by the surface of the resist layer 3b and the waveform 51 of surface-reflected light appears as shown in FIG. 6A. At this time, the intensity of the surface-reflected light to be the noise component becomes 50% of the intensity of the interface-reflected light. On the other hand, when the light containing only p-polarized light is incident on the substrate 3 at the Brewster's angle, all p-polarized light becomes the light 45 propagating through the resist layer 3b and s-polarized light reflected by the surface of the resist layer 3b does not exist. Therefore, the waveform 51 of the surface-reflected light can be eliminated as shown in FIG. 6B.

However, even if the polarizer $41a_1$ for cutting s-polarized light is provided in the optical system $41a$ of the detection unit 41, it is extremely difficult to extract only p-polarized light by removing s-polarized light completely from light owing to the angular characteristic, the wavelength characteristic, the polarization axis adjustment, and the like of the polarizer $41a_1$ itself. That is, in practice, it is almost impossible to eliminate the waveform 51 of the surface-reflected light as shown in FIG. 6B because the light obliquely incident on the substrate 3 contains s-polarized light. As also seen in FIG. 4, the reflectance of s-polarized light is relatively as high as 15% at the Brewster's angle. Therefore, at the Brewster's angle, the waveform 51 of the surface-reflected light appears if the light obliquely incident on the substrate 3 even contains any s-polarized light and the waveform 51 approaches the waveform shown in FIG. 6A as the intensity of s-polarized light increases.

Note that the reflectance of s-polarized light tends to exponentially increase as the angle θ of incidence increases, as shown in FIG. 4A. That is, the reflectance of s-polarized light decreases as the angle θ of incidence becomes smaller than the Brewster's angle. On the other hand, the reflectance of p-polarized light is as low as 5% or less although it is not 0% at an angle smaller than the Brewster's angle. It is therefore considered that, at the angle smaller than the Brewster's angle, there is the angle θ of incidence capable of making the noise component (detection error) smaller than the noise component when light is incident on the substrate 3 at the Brewster's angle.

Figure 7:
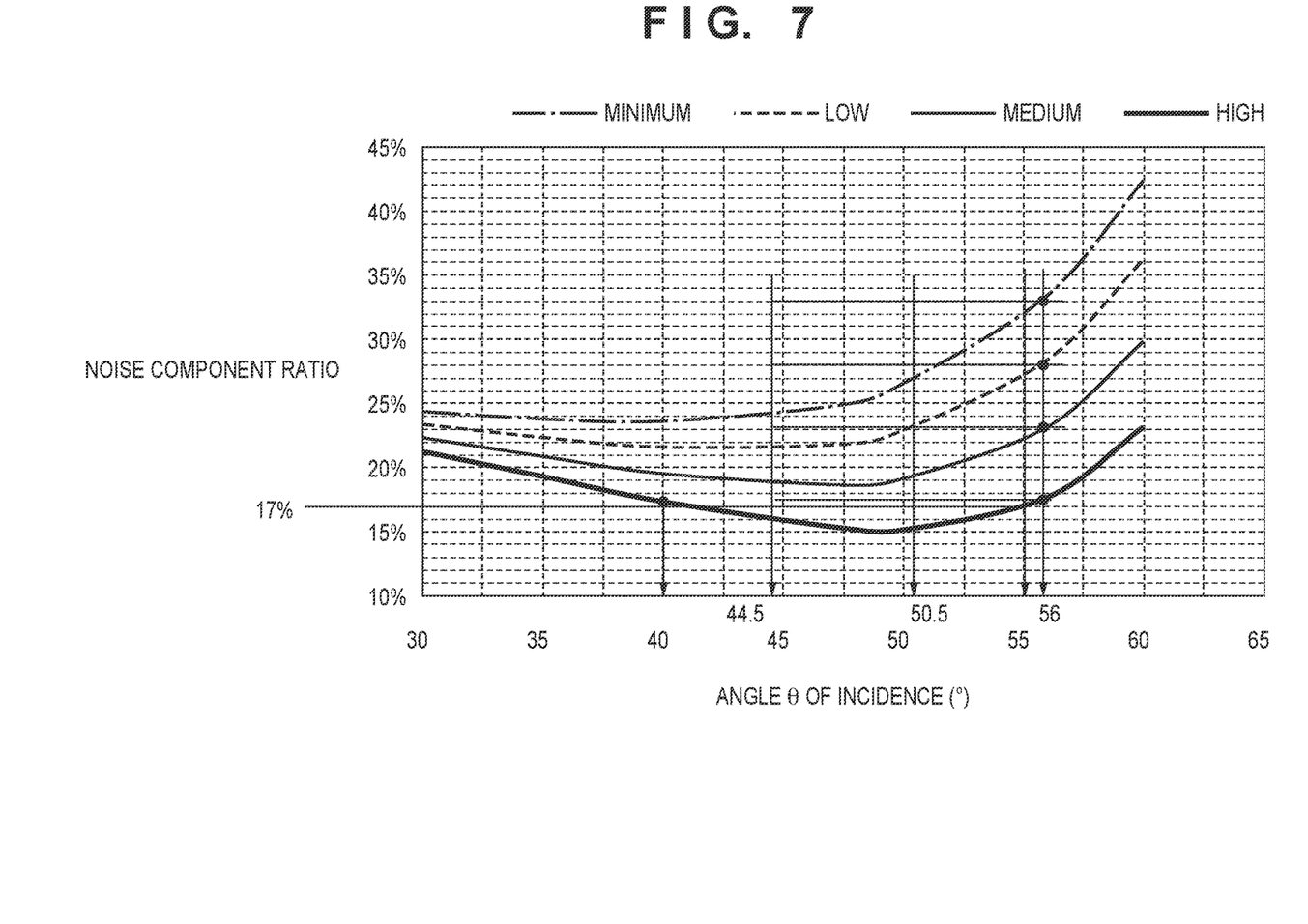
FIG. 7 is a graph showing the relationship between the angle θ of incidence and the noise component ratio.

FIG. 7 is a graph showing the relationship between the angle θ of incidence and the noise component ratio for each cutting ratio of s-polarized light. In FIG. 7, the abscissa indicates the angle θ of incidence and the ordinate indicates the ratio of the intensity of the surface-reflected light to the intensity of the interface-reflected light (to be referred to as the noise component ratio hereinafter). FIG. 7 shows the noise component ratios of four types of cutting ratios out of the range of the cutting ratio of s-polarized light achievable in practice. The four types of cutting ratios are the first cutting ratio (high), the second cutting ratio (medium), the third cutting ratio (low), and the fourth cutting ratio (minimum) in descending order of the cutting ratio of s-polarized light. As shown in FIG. 7, at the first cutting ratio (high) at which the cutting ratio of s-polarized light is the highest, the angle θ of incidence near 50° smaller than the Brewster's angle (56°) has a lower noise component ratio. This is because, as shown in FIG. 4, at the angle θ of incidence near 50°, the reflectance of p-polarized light is low near 0% as at the Brewster's angle, the reflectance of s-polarized light becomes much lower than that at the Brewster's angle. A tendency for the angle θ of incidence smaller than the Brewster's angle to have the lower noise component ratio as described above becomes more and more conspicuous as the cutting ratio of s-polarized light decreases.

Figure 8:
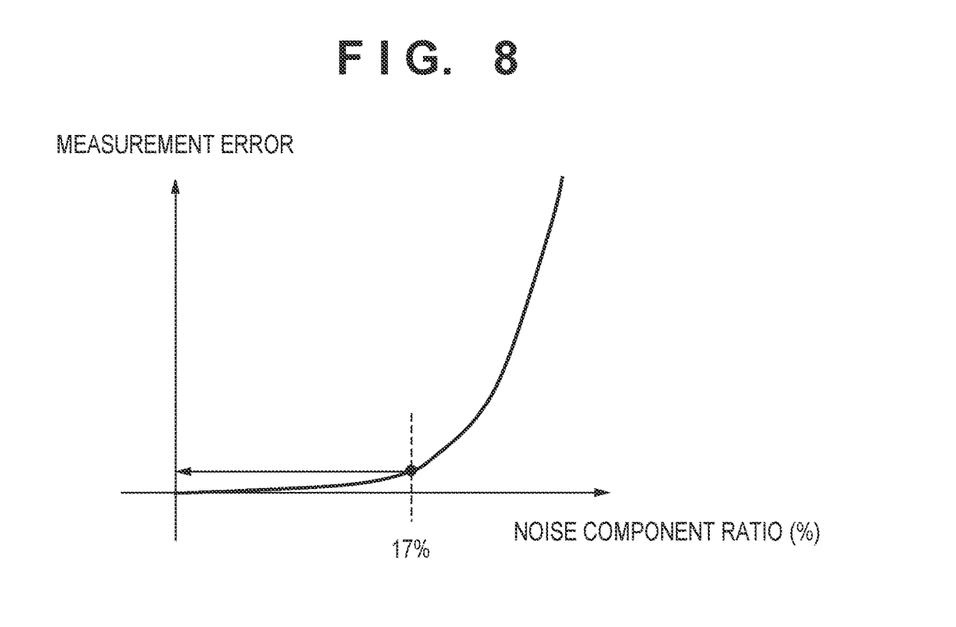
FIG. 8 is a graph showing the relationship between the noise component ratio and a measurement error.

The relationship between the noise component ratio and a measurement error (deceived measurement) will now be described with reference to FIG. 8. FIG. 8 is a graph showing the relationship between the noise component ratio and the measurement error. As shown in FIG. 8, the detection error increases greatly if the noise component ratio exceeds 17%. Therefore, the noise component ratio is preferably 17% or less. As seen in FIG. 7, the angle θ of incidence when the noise component ratio is 17% or less falls within a range of 40° to 55° at the first cutting ratio (high). It is therefore preferable, in order to detect the height of the substrate 3 (the height of the interface) accurately, that the light is obliquely incident on the substrate 3 at the angle θ of incidence falling within the range of 40° to 55°. Note that the noise component ratio does not fall to 17% or below at cutting ratios other than the first cutting ratio (high). That is, in order to detect the height of the substrate 3 accurately, the cutting ratio of s-polarized light is preferably maximized.

Figure 9A:
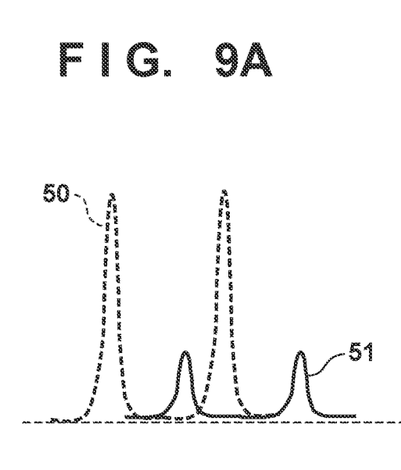
FIG. 9A is a chart showing the waveform of interface-reflected light and the waveform of surface-reflected light.
Figure 9B:
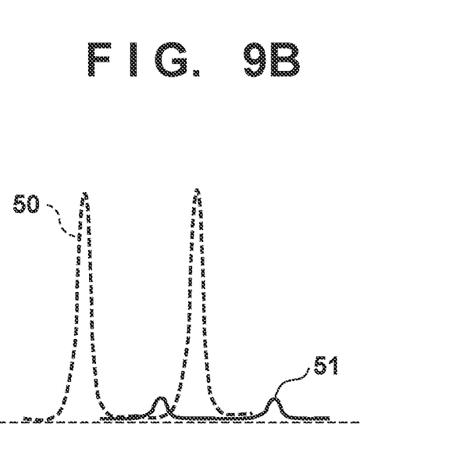
FIG. 9B is a chart showing the waveform of interface-reflected light and the waveform of surface-reflected light.

The waveform 50 of interface-reflected light and the waveform 51 of surface-reflected light when light is obliquely incident on the substrate 3 at the angle θ of incidence of 47.5° as the intermediate angle in the range of 40° to 55° will now be described with reference to FIGS. 9A and 9B. FIG. 9A is a chart showing the waveform 50 of interface-reflected light and the waveform 51 of surface-reflected light when light containing s-polarized light and p-polarized light is incident on the substrate 3 at the angle θ of incidence of 47.5°. FIG. 9B is a chart showing the waveform 50 of interface-reflected light and the waveform 51 of surface-reflected light when light containing only p-polarized light is incident on the substrate 3 at the angle θ of incidence of 47.5°.

When light containing s-polarized light and p-polarized light is incident on the substrate 3 at the angle θ of incidence of 47.5°, the intensity of surface-reflected light to be the noise component becomes 35% of the intensity of interface-reflected light, as shown in FIG. 9A. This is lower than the noise component ratio (50%) shown in FIG. 6A when light is incident on the substrate 3 at the Brewster's angle (56°). That is, it is possible to measure the height of the substrate (interface) more accurately by causing light to be incident on the substrate 3 at the angle θ of incidence of 47.5° than by causing light to be incident on the substrate 3 at the Brewster's angle.

On the other hand, when light containing only p-polarized light is incident on the substrate 3 at the angle θ of incidence of 47.5°, the intensity of surface-reflected light to be the noise component becomes 5% of the intensity of interface-reflected light, as shown in FIG. 9B. This is higher than the noise component ratio (0%) shown in FIG. 6B when the light is incident on the substrate 3 at the Brewster's angle (56°). As described above, however, it is extremely difficult to extract only p-polarized light by removing s-polarized light completely from light. That is, when light with s-polarized light remaining is incident on the substrate 3 at the Brewster's angle, the waveform 50 of interface-reflected light and the waveform 51 of surface-reflected light become similar to shapes (noise component ratio: 50%) shown in FIG. 6A. On the other hand, when light with s-polarized light remaining is incident on the substrate 3 at the angle θ of incidence of 47.5°, the waveform 50 of the interface-reflected light and the waveform 51 of the surface-reflected light become similar to shapes (noise component ratio: 35%) shown in FIG. 9A. That is, considering an achievable cutting ratio of s-polarized light, it is possible to make the noise component ratio lower by causing light to be incident on the substrate 3 at the angle θ of incidence of 47.5° than by causing light to be incident on the substrate 3 at the Brewster's angle even if the polarizer $41a_1$ which reduces s-polarized light is used. That is, it is possible to measure the height of the substrate (interface) more accurately by causing light to be incident on the substrate 3 at the angle θ of incidence of 47.5° than by causing light to be incident on the substrate 3 at the Brewster's angle.

As shown in FIG. 7, the noise component ratio at the angle θ of incidence smaller than the Brewster's angle (56°) by about 10° (10°±3°) becomes lower than that at the Brewster's angle in all the four types of cutting ratios. In particular, when the angle θ of incidence falls within a range of 44.5° to 50.5°, the noise component ratio becomes lower than that at the Brewster's angle (56°). For example, when the cutting ratio of s-polarized light is the first cutting ratio (high), the noise component ratio becomes about 16% at the angle θ of incidence of 44.5° and about 15% at the angle θ of incidence of 50.5°, and thus becomes lower than the noise component ratio (17.8%) at the Brewster's angle. Even if the cutting ratio of s-polarized light is each of the second to fourth cutting ratios, the noise component ratio at the angles θ of incidence of 44.5° and 50.5° also becomes lower than the noise component ratio at the Brewster's angle, as at the first cutting ratio. It is therefore preferable that the angle θ of incidence of light when the detection unit 41 detects the height of the substrate 3 falls within the range of 44.5° to 50.5°. Even if it is difficult for the angle θ of incidence to fall within the range of 44.5° to 50.5° owing to, for example, arrangement space, the angle θ of incidence suffices to fall within the range of 40° to 55° from the above-described result.

Figure 10:
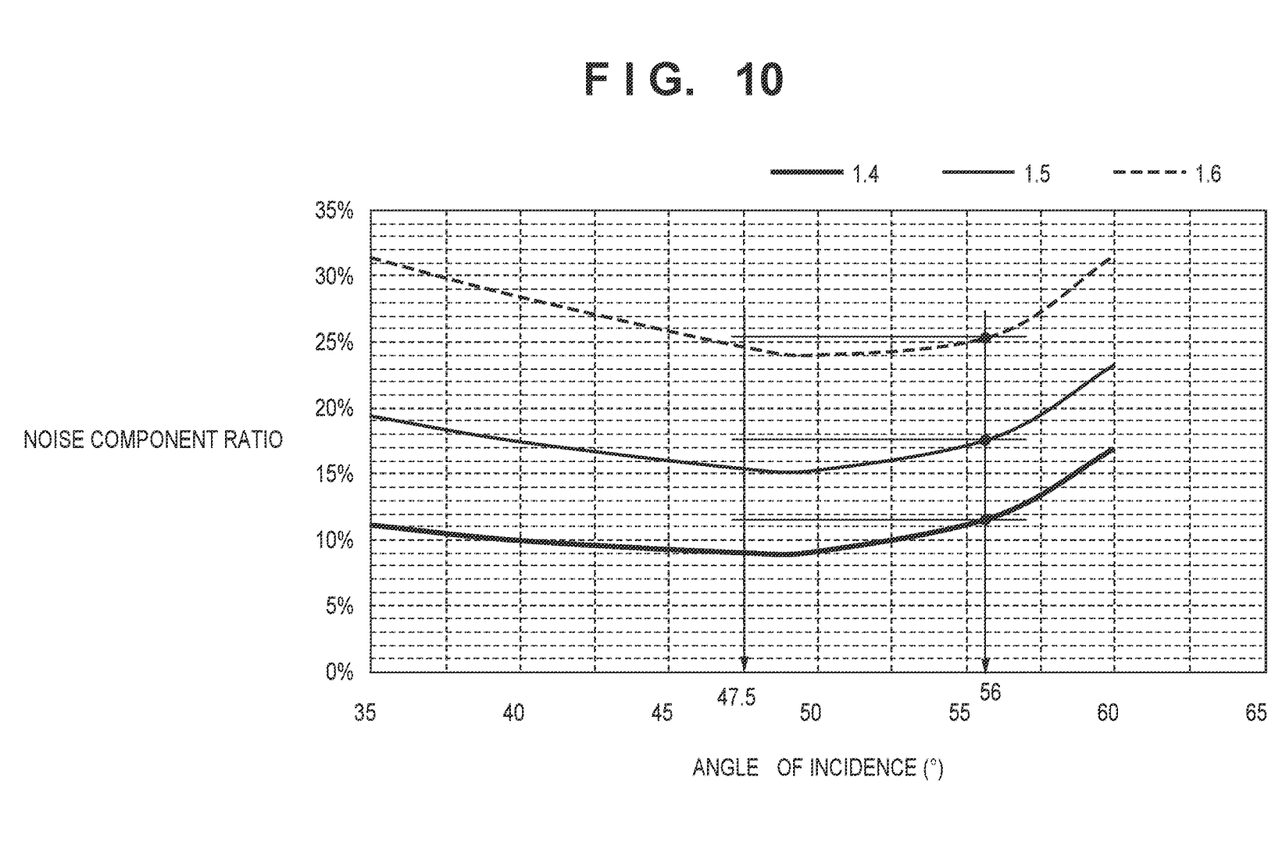
FIG. 10 is a graph showing the relationship between the angle θ of incidence and the noise component ratio.

In this embodiment, a case has been described in which the refractive index of the resist layer 3b is 1.5. However, the present invention is applicable to a case other than the case in which the refractive index of the resist layer 3b is 1.5. FIG. 10 is a graph showing the relationship between the angle θ of incidence and the noise component ratio when the cutting ratio of s-polarized light is the first cutting ratio (high) and the refractive index of the resist layer 3b is 1.4 to 1.6. In all cases in which the refractive indices of the resist layer 3b are 1.4, 1.5, and 1.6, the noise component ratio at the angle θ of incidence of 47.5° becomes lower than that at the Brewster's angle. That is, even in the cases other than the case in which the refractive index of the resist layer 3b is 1.5, light is incident on the substrate 3 at the angle θ of incidence falling within the range of 40° to 55°, and preferably at the angle θ of incidence falling within the range of 44.5° to 50.5°.

Further, as shown in FIG. 10, the angle θ of incidence when the noise component ratio becomes the lowest changes depending on the refractive index of the resist layer 3b. Therefore, the detection unit 41 may include a driving unit 42a which drives the optical system 41a to change the angle θ of incidence. Likewise, the detection unit 41 may include a driving unit 42b which drives the detection system 41b in accordance with the angle θ of incidence. In this case, the control unit 17 may obtain, in advance, information indicating the relationship between the angle θ of incidence and the refractive index of the top layer (resist layer 3b) in the substrate 3, and may control the driving unit 42a based on the information and the refractive index of the top layer. Information indicating the refractive index of the top layer in the substrate 3 can be set by a user or the like.

Embodiment of Method of Manufacturing Article

A method of manufacturing an article according to an embodiment of the present invention is suitable for manufacturing an article, for example, an electronic device such as a semiconductor device or an element having a microstructure. The method of manufacturing the article according to this embodiment includes a step of forming a latent image pattern on a photoresist applied to a substrate using the above-described exposure apparatus (step of exposing the substrate) and a step of developing the substrate on which the latent image pattern has been formed in the preceding step. This manufacturing method further includes other known steps (oxidation, deposition, vapor deposition, doping, planarization, etching, resist removal, dicing, bonding, packaging, and the like). The method of manufacturing the article according to this embodiment is advantageous in at least one of the performance, the quality, the productivity, and the production cost of the article, as compared with a conventional method.

Other Embodiments

Embodiment(s) of the present invention (the control unit) can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-093518 filed on Apr. 30, 2015, which is hereby incorporated by reference herein in its entirety.

What is claimed is:

1. A detection apparatus for causing light to be incident obliquely on a substrate including a plurality of layers, including a top layer and an underlying layer, whose refractive indices are different from each other and detects a height of the substrate using light reflected from an interface between the top layer and the underlying layer, the apparatus comprising:
an optical system including a polarizer for reducing, without completely removing, s-polarized light from light containing p-polarized light and the s-polarized light, and causing the light, in which the s-polarized light has been reduced by the polarizer, to be incident on the substrate,
wherein the optical system is configured to cause the light to be incident on the substrate at an angle of incidence by which a ratio of an intensity of light reflected from a surface of the top layer to an intensity of light reflected from the interface is less than that in a case where the angle of incidence is a Brewster's angle.

2. The apparatus according to claim 1, wherein the optical system is configured to cause the light to be incident on the substrate at the angle of incidence within a range of 40° to 55°.

3. The apparatus according to claim 1, wherein the optical system is configured to cause the light to be incident on the substrate at the angle of incidence by which the ratio is not greater than 17%.

4. The apparatus according to claim 1, wherein the optical system is configured to cause light to be incident on the substrate at the angle of incidence within a range of 44.5° to 50.5°.

5. The apparatus according to claim 1, further comprising:
a driving device configured to change an angle of incidence of light onto the substrate; and
a controller configured to control the driving device based on information indicating a relation between an angle of incidence in a case where a ratio of an intensity of light reflected from the surface of the top layer to an intensity of light reflected from the interface becomes lowest, and a refractive index of the top layer.

6. The apparatus according to claim 1, wherein the angle of incidence at which the optical system causes the light to be incident on the substrate is set in accordance with a refractive index of the top layer, so that a ratio of an intensity of light reflected from the surface of the top layer to an intensity of light reflected from the interface is minimized.

7. The apparatus according to claim 1, wherein the optical system is configured to cause the light to be incident on the substrate at the angle of incidence smaller than the Brewster's angle.

8. A measurement apparatus for measuring a position of a mark on a substrate, the apparatus comprising:
a stage configured to hold the substrate and being movable; and
a detection apparatus configured to cause light to be incident obliquely on the substrate including a plurality of layers, including a top layer and an underlying layer, whose refractive indices are different from each other and detect a height of the substrate using light reflected from an interface between the top layer and the underlying layer,
wherein the detection apparatus comprises:
an optical system including a polarizer for reducing, without completely removing, s-polarized light from light containing p-polarized light and the s-polarized light, and causing the light, in which the s-polarized light has been reduced by the polarizer, to be incident on the substrate,
wherein the optical system is configured to cause the light to be incident on the substrate at an angle of incidence by which a ratio of an intensity of light reflected from a surface of the top layer to an intensity of light reflected from the interface is less than that in a case where the angle of incidence is a Brewster's angle,
wherein the stage is controlled based on a detection by the detection apparatus such so that a height of the mark falls within a tolerance.

9. A lithography apparatus for performing patterning on a substrate, the apparatus comprising:
a measurement apparatus configured to measure a position of a mark on the substrate,
wherein the measurement apparatus includes:
a stage configured to hold the substrate and being movable; and
a detection apparatus configured to cause light to be incident obliquely on the substrate including a plurality of layers, including a top layer and an underlying layer, whose refractive indices are different from each other and detect a height of the substrate using light reflected from an interface between the top layer and the underlying layer,
wherein the detection apparatus comprises:
an optical system including a polarizer for reducing, without completely removing, s-polarized light from light containing p-polarized light and the s-polarized light, and causing the light, in which the s-polarized light has been reduced by the polarizer, to be incident on the substrate,
wherein the optical system is configured to cause the light to be incident on the substrate at an angle of incidence by which a ratio of an intensity of light reflected from a surface of the top layer to an intensity of light reflected from the interface is less than that in a case where the angle of incidence is a Brewster's angle, wherein the stage is controlled based on a detection by the detection apparatus so that a height of the mark falls within a tolerance.

10. A method of manufacturing an article, the method comprising steps of:

performing patterning on a substrate using an lithography apparatus;

processing the substrate, on which the patterning has been performed, to manufacture the article, wherein the lithography apparatus performs patterning on the substrate, the apparatus including:

a measurement apparatus configured to measure a position of a mark on the substrate, wherein the measurement apparatus includes:

a stage configured to hold the substrate and being movable; and a detection apparatus configured to cause light to be incident obliquely on the substrate including a plurality of layers, including a top layer and an underlying layer, whose refractive indices are different from each other and detect a height of the substrate using light reflected from an interface between the top layer and the underlying layer, wherein the detection apparatus includes:

an optical system including a polarizer for reducing, without completely removing, s-polarized light from light containing p-polarized light and the s-polarized light, and causing the light, in which the s-polarized light has been reduced by the polarizer, to be incident on the substrate, wherein the optical system is configured to cause the light to be incident on the substrate at an angle of incidence by which a ratio of an intensity of light reflected from a surface of the top layer to an intensity of light reflected from the interface is less than that in a case where the angle of incidence is a Brewster's angle, wherein the stage is controlled based on a detection by the detection apparatus so that a height of the mark falls within a tolerance.

* * * * *